April 1, 1969 H. H. K. WESEMEYER 3,436,624

SEMICONDUCTOR BI-DIRECTIONAL COMPONENT

Filed May 10, 1966

INVENTOR.
Harald Heinrich Kurt Wesemeyer

BY Hane and Nydick
Attorneys

United States Patent Office 3,436,624
Patented Apr. 1, 1969

3,436,624

SEMICONDUCTOR BI-DIRECTIONAL COMPONENT

Harald Heinrich Kurt Wesemeyer, Nynashamn, Sweden, assignor to Telefonaktiebolaget L M Ericsson, Stockholm, Sweden, a corporation of Sweden Filed May 10, 1966, Ser. No. 549,054
Claims priority, application Sweden, June 1, 1965, 7,142/65
Int. Cl. H01l *3/00, 15/00;* H03k *17/56*
U.S. Cl. 317—237 5 Claims

ABSTRACT OF THE DISCLOSURE

A semiconductor bi-directional component is fabricated by adhering a layer of electrical insulating material on the flat surface of a metallic plate electrode. There is an aperture through the insulating material. The aperture houses a solid-state body of semiconductor material which has one end in contact with the metallic plate electrode. The top of the insulating layer is covered with a metallic surface which is in contact with the other end of the solid-state body. The ohmic state of the solid-state body is controlled by the voltages applied across the solid-state body.

The present invention refers to a semiconductor component comprising a resistance layer between a first connection terminal and a second connection terminal wherein resistance layer has the property of changing from a first resistance value to a substantially different second resistance value, when the voltage applied to said layer exceeds a certain predetermined voltage value, or when—which is equivalent—the applied electric effect or the heating effect brought about in any other way in the resistance layer exceeds a predetermined value.

In semiconductor components of this kind considerable temperature increases occur during operation. These temperature increases in the active material of the components cause a decomposition of the material to radicals and even to atomic ions. Furthermore there are large axial and radial temperature gradients in the material as well as great electric field forces, which cause a non-stationary diffusion at a sufficiently large ion mobility of the integrating elements, that is, ions or radicals. When ions with a reciprocally considerably different mobility power are present, this diffusion may give rise to a considerable conversion of composition of the material, whereby the properties of the components are changed in an uncontrollable and undesirable way.

It is an object of the invention to eliminate this disadvantage.

A semiconductor component designed in accordance with the invention is characterized thereby that the extension of the resistance layer perpendicularly to the direction of the current through the layer is decidedly limited and the diameter of the layer substantially corresponds to the diameter of a resistance layer required for the passage of a desired maximum current.

The invention will be further described in connection with the accompanying drawing, in which FIGS. 1–12 schematically show some phases of the manufacture of components in accordance with the invention.

FIG. 1 shows a support plate 10 of for example molybdenum, on which a layer 11 of aluminium has been vacuum-deposited. The layer has a thickness of about $15 \cdot 10^{-3}$ mm. On top of layer 11 is a layer of photosensitive material.

FIG. 2 shows the arrangement in accordance with FIG. 1 with a screen 20 placed above the layer 12. The holes of the screen have a diameter of about $60 \cdot 10^{-3}$ mm. The screen 20 is illuminated with ultraviolet light so that the parts of the layer 12, located first below the holes of the screen, are exposed.

Figure 1:
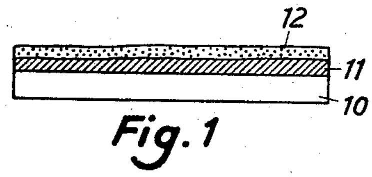
Figure 2:
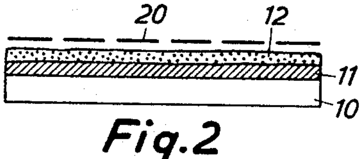
Figure 3:
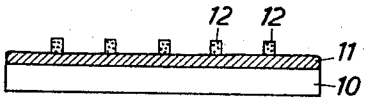
FIG. 3 shows the invention in accordance with FIG. 2 after a development process so that all the material 12, with the exception of the "islands" just below the holes of the screen 20, is eliminated.
Figure 4:
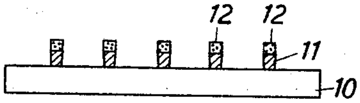
FIG. 4 shows the arrangement in accordance with FIG. 3 after etching with for example NaOH so that all of the aluminium material has been eliminated, except the material just below the "islands" 12.
Figure 5:
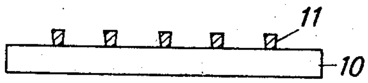

FIG. 5 shows the arrangement in accordance with FIG. 4 after elimination of the photosensitive material 12 on the aluminium material 11, whereby a number of faintly conic cylinders has been obtained on the plate 10, each cylinder having its smallest diameter close to the plate.

Figure 6:
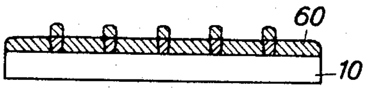

FIG. 6 shows the arrangement in accordance with FIG. 5 after a layer 60 of silicon monoxide SiO with a thickness of about $15 \cdot 10^{-3}$ mm. has been applied to plate 10.

Figure 7:
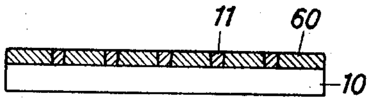

FIG. 7 shows the arrangement in accordance with FIG. 6 after having ground the surface layer of silicon monoxide down to a thickness of about $10 \cdot 10^{-3}$ mm. The main part of the surface is dark brown while the aluminium islands appear as white lustrous spots.

Figure 8:
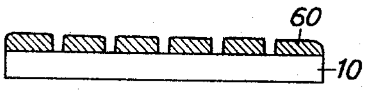

FIG. 8 shows the arrangement in accordance with FIG. 7 after etching with for example NaOH so that all of the aluminium is eliminated. A silicon monoxide layer 60 is obtained on the molybdenum plate, in which layer there is located a number of faintly conic holes with a diameter of about $50 \cdot 10^{-3}$ mm.

Figure 9:
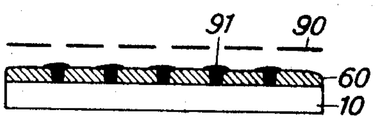

FIG. 9 shows the arrangement in accordance with FIG. 8 after the actual resistance layer 91 has been vacuum deposited through a screen 90. It is this resistance layer that gives the finished semiconductor component the particular property of changing from a first resistance value (for example $10^6$ ohms) to a second resistance value (for example 1 ohm) when the voltage applied across the component exceeds a predetermined voltage value (for example 70 volt). The materials used for such resistance layers are known, see U.S. Patent 3,271,591 (corresponding to the U.S. patent application 310,407, filed Sept. 20, 1963), which teach different compositions of resistance material, obtained by a smelting process of certain material components in certain percental combinations, whereby the resistance material is obtained as a solid, homogeneous smelting product of a vitreous, mainly amorphous structure. Some examples of compounds are given below, the indicated percentage figures being percentages by weight.

THRESHOLD

| | Percent |
|---|---|
| Tellurium | 65–86 |
| Arsenic | 24–10 |
| Germanium | 7–2 |
| Silicon | 4–2 |

MEMORY

| | |
|---|---|
| Tellurium | 90 |
| Germanium | 10 |

MEMORY

| | |
|---|---|
| Tellurium | 77 |
| Arsenic | 4 |
| Germanium | 19 |

MEMORY

| | |
|---|---|
| Tellurium | 73 |
| Arsenic | 19 |
| Zinc | 3 |
| Silicon | 5 |

THRESHOLD

| | |
|---|---|
| Tellurium | 86.0±4 |
| Arsenic | 10.0+2 |
| Germanium | 2.2+1 |
| Silicon | 1.8±1 |

Figure 10:
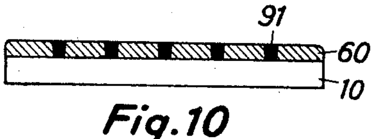

FIG. 10 shows the arrangement in accordance with FIG. 9 after the surface of the layer 60 has been ground.

Figure 11:
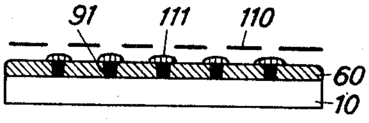
Figure 12:
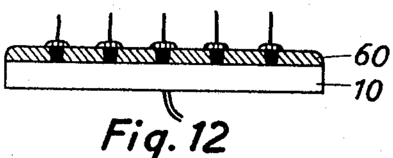

FIG. 11 shows how the contact material 111, for example molybdenum, is deposited on the cones 91 through a screen 110, and FIG. 12 shows the final product comprising several semiconductor components with the first connection terminal in common and individual second connections terminals. In this way the final product is obtained, consisting of a support plate 10 of molybdenum, several cones 91 of a particular resistance material and contact surfaces 111 of molybdenum on cones 91. In the present case cones 91 have a diameter of about $50 \cdot 10^{-3}$ mm., which is a suitable dimension as the desired maximum current through a semiconductor component with the stated composition is to amount to about 5 ma.

A semiconductor component in accordance with the invention with a diameter of the resistance cylinder between the connection terminals limited in dependence of the desired maximum current through the component, has the property of working, during a long operating time, with the rated data for which it is dimensioned and intended. According to a further development of the inventive idea it is possible in some cases to accentuate this property even more; this result being achieved thereby that the integrating elements of the resistance material are chosen in such a way that, in an ionized condition, they have the same mobility relative to each other. There is thus avoided to a still greater extent, an unequal material propagation influenced by high temperatures and field forces.

Once the idea of the resistance layer, limited in the cross direction, has come forth, it is no problem to decide upon the diameter of the resistance layer of the component most suitable for each different case. This is readily done by practical experiments and/or by technical calculations.

According to a further development of the inventive idea it has proved suitable to let the manufacturing process have such a course that the resistance layer is given a somewhate larger material concentration in its peripherical portion that in its central portion. By this measure a diffusion, caused by a strong electric field or by a large temperature gradient, will be counteracted by a diffusion in opposite direction, caused by an existent concentration gradient.

I claim:

1. Semiconductor component comprising a bi-directional semiconductor current controlling device including two longitudinally displaced connection terminals, one of said connection terminals including a metallic plate electrode, a body of solid-state semiconductor material element extending between and in contact with said two connection terminals, said solid-state semiconductor material element including a layer of electrical insulating material adhering to said plate electrode, said insulating layer having an aperture extending therethrough to said plate electrode, said solid-state body of semiconductor material substantially of the same size and filling the aperture with one end thereof ohmically connected to said plate electrode, and the other of said connection terminals including a layer of metallic material on said insulating layer covering the other end of said aperture and ohmically connected to the other end of said body of semiconductor material, said solid-state semiconductor material element in one conduction state having at least portions thereof between the connection terminals in one structural state which is of high resistance and substantially an insulator for blocking the flow of current therethrough in either or both directions, when an applied voltage is below an upper threshold voltage level, and in another conduction state having at least portions thereof between the connection terminals in another structural state providing a current channel which is of low resistance and substantially a conductor for conducting the flow of current therethrough in either or both directions, when the applied voltage is raised above the upper threshold voltage level, the width of said semiconductor material element in the direction perpendicular to the direction of the current channel being very limited and substantially corresponding to the width normally required for the passage of a desired maximum current in said other structural state of low resistnce.

2. Semiconductor component according to claim 1, wherein the solid state semiconductor material consists of integrating elements, which, in an ionized condition, have substantially the same mobility relative to each other.

3. Semiconductor component according to claim 1, wherein said semiconductor material has a larger material concentration in its peripherical portion than in the central portion along the center line of the current channel, whereby a diffusion, caused by a strong electric field or by a large temperature gradient, is counteracted by a diffusion in opposite direction because of an existent concentration gradient.

4. The semiconductor components of claim 1 wherein said aperture and said body of semiconductor material having a cross-section adjacent to said plate electrode which is less than the cross-sections thereof adjacent to said layer of metallic material.

5. A semiconductor bi-directional component comprising a metallic plate electrode with a flat surface, a layer of electrical insulating material adhering to said surface, said insulating layer having an aperture extending through it perpendicularly to the flat surface, a solid state body of semiconductor material substantially of the same size and filling the aperture with one end thereof ohmically connected to the flat surface of said plate electrode, a metallic surface on said insulating layer covering the other end of said aperture and ohmically connected to the other end of the said semiconductor body, said semiconductor material including means for providing a first condition of relatively high resistance of said material for substantally blocking current between said electrodes upon application of a voltage to said electrodes below a threshold value, said semiconductor material including means responsive to a voltage of at least said threshold value, applied to said electrodes, for altering said first condition of relatively high resistance of said semiconductor material for substantially instantaneously providing at least one path through said semiconductor material between the electrodes having a second condition of relatively low resistance of said material for conducting current between said electrodes substantially equal in each direction, said semiconductor material including means for maintaining at least said one path through said semiconducting material in its second condition of relatively low resistance and providing a substantially constant ratio of voltage change to current change for conducting current therethrough between the electrodes at a substantially constant voltage above a minimum current holding value, and providing a voltage drop across the at least one path through said semiconductor material in its said second relatively low resistance conducting condition, which is a minor fraction of the voltage drop across said semiconductor material in its first relatively high resistance current blocking condition, and said semiconductor material including means responsive to a decrease in current through said at least one path through said semiconductor material, in its second relatively low resistance conducting condition, to a value below said minimum current holding value for immediately realtering said second relatively low resistance conducting condition of said at least one path through said semiconductor material to said first relatively high resistance blocking condition.

References Cited

UNITED STATES PATENTS

| | | | |
|---|---|---|---|
| 2,648,805 | 8/1953 | Spenke | 317—235 |
| 2,930,950 | 3/1960 | Teszner | 317—235 |
| 3,271,591 | 9/1966 | Ovshinsky | 317—237 |

JAMES D. KALLAM, *Primary Examiner.*

U.S. Cl. X.R.

307—258; 317—235